United States Patent
Krampotich

(10) Patent No.: US 6,981,750 B2
(45) Date of Patent: Jan. 3, 2006

(54) RETAINER FOR HINGED DOOR

(75) Inventor: Dennis J. Krampotich, Shakopee, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 125 days.

(21) Appl. No.: 10/244,829

(22) Filed: Sep. 16, 2002

(65) Prior Publication Data

US 2004/0051426 A1   Mar. 18, 2004

(51) Int. Cl.
   *A47B 81/00*   (2006.01)
(52) U.S. Cl. ............... 312/223.1; 312/329; 16/380
(58) Field of Classification Search ............ 312/223.1, 312/326, 329, 265.1, 265.2, 265.3, 265.4; 174/50; 292/DIG. 17; 16/257, 258, 380
See application file for complete search history.

(56) References Cited

U.S. PATENT DOCUMENTS

| | | | | |
|---|---|---|---|---|
| 1,327,624 A | * | 1/1920 | Manny | 402/77 |
| 1,425,995 A | * | 8/1922 | McGiveney | 16/229 |
| 4,049,311 A | * | 9/1977 | Dietrich et al. | 410/138 |
| 4,503,582 A | * | 3/1985 | Gurubatham | 16/232 |
| 4,561,147 A | * | 12/1985 | Katoh et al. | 16/380 |
| 5,337,453 A | * | 8/1994 | Bargesser | 16/380 |
| 5,711,053 A | * | 1/1998 | Hafner | 16/380 |
| 5,899,545 A | * | 5/1999 | Besserer et al. | 312/257.1 |
| 5,938,302 A | * | 8/1999 | Anderson et al. | 312/223.1 |
| 6,006,925 A | * | 12/1999 | Sevier | 211/26 |
| 6,065,612 A | * | 5/2000 | Rinderer | 211/26 |
| 6,354,461 B1 | * | 3/2002 | Tenney et al. | 220/836 |
| 6,411,515 B1 | * | 6/2002 | Sakamoto et al. | 361/704 |
| 6,467,640 B1 | * | 10/2002 | Hung | 220/4.02 |
| 6,754,066 B2 | * | 6/2004 | Doan et al. | 361/600 |

OTHER PUBLICATIONS

H.A. Guden Co., Inc. Catalog, Dated Jan. 1, 2002, Front Cover, Inside Front Cover, pp. 1 to 44, Inside Back Cover, Back Cover.

* cited by examiner

*Primary Examiner*—Janet M. Wilkens
(74) *Attorney, Agent, or Firm*—Merchant & Gould P.C.

(57) ABSTRACT

An assembly for managing cables in a telecommunications installation where the cable management troughs directing cables from telecommunications equipment mounted to an equipment rack to a vertical cable way allow air flow into a ventilation space located between the equipment rack and the vertical cable way. A cable management trough with front and rear walls and a floor, wherein the floor increases in width from a first end to a second end and the front and rear walls decreases in height from the first end to the second end. A releasable hinge for mounting a door to a telecommunications rack and a slide movable between a captive and a retracted position. Placing the slide in the captive position prevents the door from being lifted from the hinge and placing the slide in a retracted position permits the door to be removed from the rack.

22 Claims, 18 Drawing Sheets

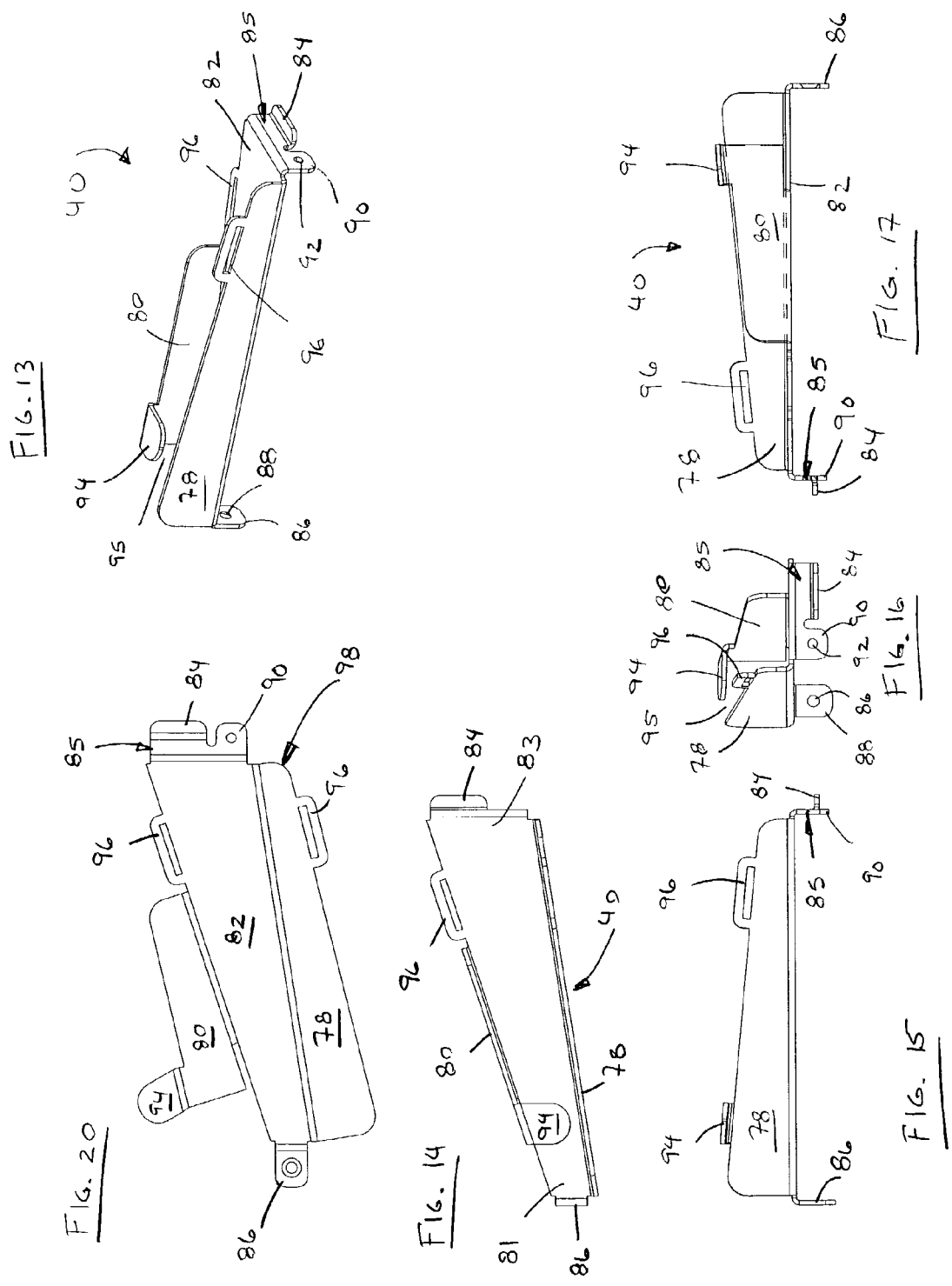

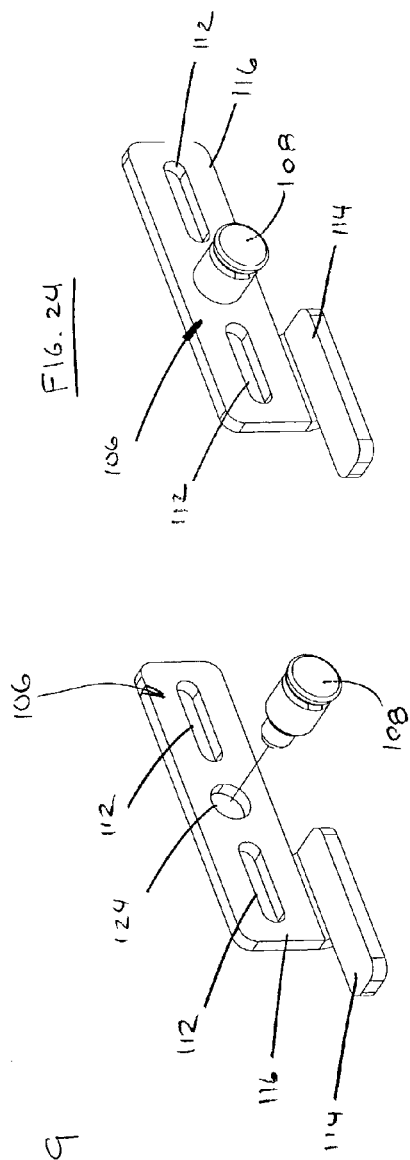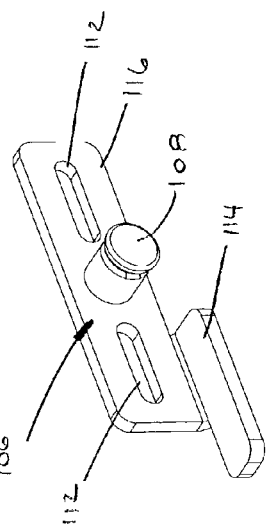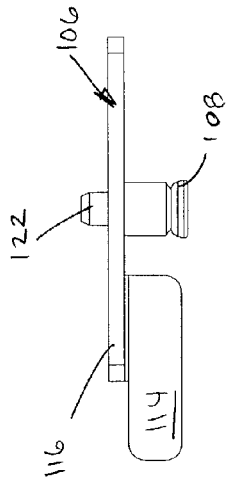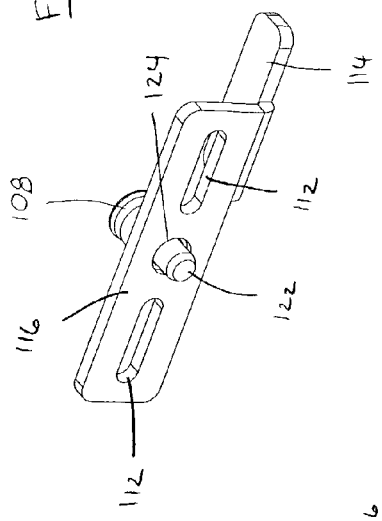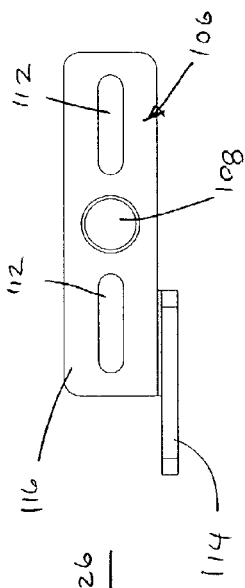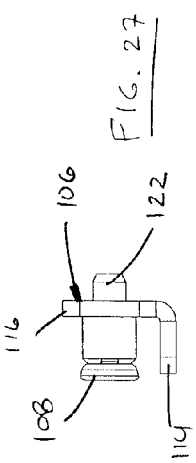

RETAINER FOR HINGED DOOR

FIELD OF THE INVENTION

The present invention relates generally to removable hinged doors for use with telecommunications equipment and cable management structures.

BACKGROUND OF THE INVENTION

Equipment mounted to telecommunications equipments racks often requires that air be able to flow through the outer wall of the racks to permit cooling of the equipment. It is desirable that telecommunications and power cables extending to and from the racks and the equipment mounted in the racks be managed in an organized fashion. To manage such cables, cable management structures may be mounted adjacent to the equipment racks. It is desirable to have structures directing the cables to and from such racks which do not overly impede the flow of air about the racks.

Cable management structures often house and organize a large number of telecommunications cables. To prevent unwanted tampering and accidental contact with the cables with the structure, doors may be used to cover openings providing access to the cables. It is desirable that such doors be selectively removable to improve access to the cables for installation or maintenance.

SUMMARY OF THE INVENTION

The present invention relates to an assembly for managing cables in a telecommunications installation where the cable management troughs directing cables from telecommunications equipment mounted to an equipment rack to a vertical cable way allow air flow into a ventilation space located between the equipment rack and the vertical cable way.

The present invention further relates to a cable management trough with front and rear walls and a floor, wherein the floor increases in width from a first end to a second end and the front and rear walls decreases in height from the first end to the second end.

The present invention also relates to a releasable hinge for mounting a door to a telecommunications rack and a slide movable between a captive and a retracted position. Placing the slide in the captive position prevents the door from being lifted from the hinge and placing the slide in a retracted position permits the door to be removed from the rack.

BRIEF DESCRIPTION OF THE DRAWINGS

The accompanying drawings, which are incorporated in and constitute a part of the description, illustrate several aspects of the invention and together with the description, serve to explain the principles of the invention. A brief description of the drawings is as follows:

FIG. 13 is a front perspective view of a cable management trough for use with the telecommunications equipment rack for cable management of FIG. 8.

FIG. 14 is a top view of the trough of FIG. 13.

FIG. 15 is a front view of the trough of FIG. 13.

FIG. 16 is a first end view of the trough of FIG. 13.

FIG. 17 is a rear view of the trough of FIG. 13.

FIG. 20 is a top view of a sheet of metal configured to be formed into the trough of FIG. 13.

FIG. 24 is a first front perspective view of the slide of FIG. 21.

FIG. 25 is a second front perspective view of the slide of FIG. 24.

FIG. 26 is a side view of the slide of FIG. 24.

FIG. 27 is a rear view of the slide of FIG. 24.

FIG. 28 is a top view of the slide of FIG. 24.

FIG. 29 is an exploded front perspective view of the slide of FIG. 24.

DETAILED DESCRIPTION

Figure 1:
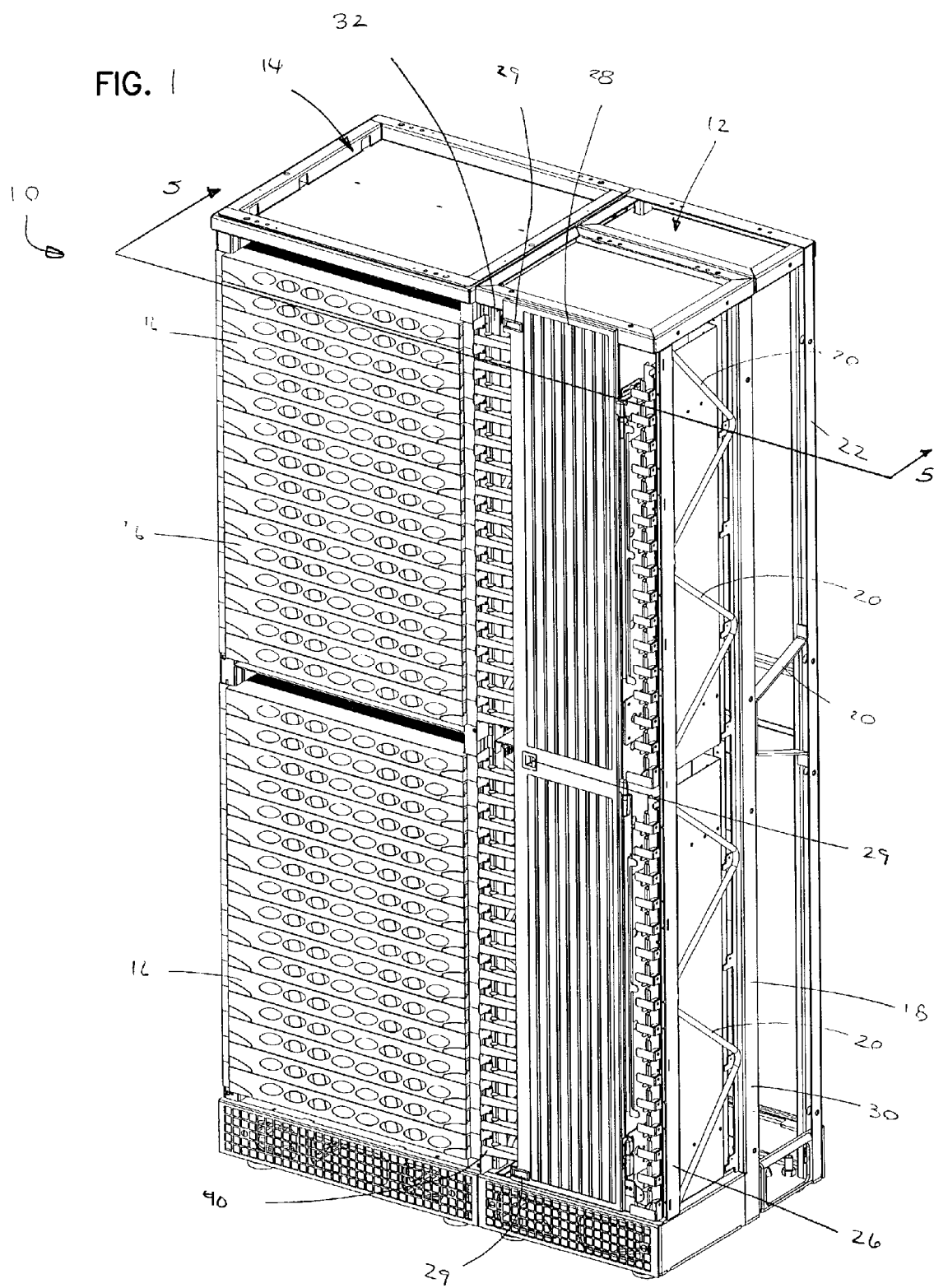
FIG. 1 is a first front perspective view of a telecommunications equipment rack for cable management according to the present invention mounted adjacent to a telecommunications equipment rack with optical switching equipment mounted.

Telecommunications equipment installations may include a wide variety of different types of telecommunications equipment. To permit increased density and improved organization of such installations, the equipment may be mounted in one or more equipment racks, such as a rack 14 as shown in FIG. 1. These racks may be installed side-by-side with other racks in a linear row or line-up, such as rack 14 and rack 12 as shown in FIG. 1. Mounted to rack 14 is a plurality of optical switch units 16. Each switch unit 16 will have a plurality of optical fiber cables extending from the switch unit and which may extend to other telecommunications equipment within the lineup, the installation or some other location. As shown in FIG. 1, thirty-two switch units 16 are mounted to rack 14. To manage the many cables (see for example cables 17 in FIG. 12) that may extend from rack 14, rack 12 may be mounted adjacent to rack 14 in a line up to provide cable management. Switch units 16 also may include heat producing elements within an enclosed housing, and airflow about these housings may be important to the improve heat dissipation. Rack 12 is configured to provide cable management directly adjacent to rack 14 and still permit sufficient airflow through rack 14 to permit heat dissipation from switch units 16.

Figure 2:
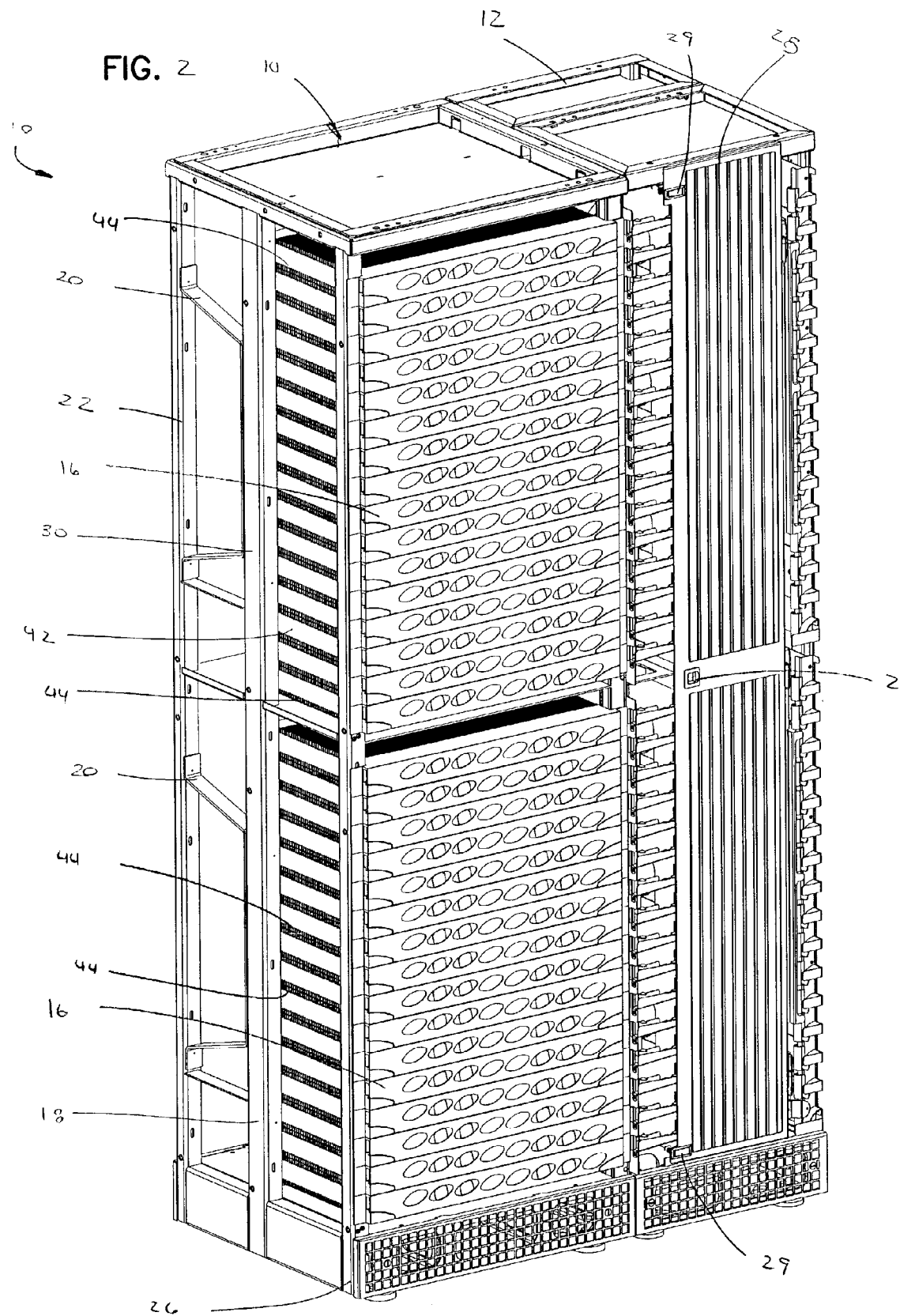
FIG. 2 is a second front perspective view of the equipment racks of FIG. 1.

Referring now to FIGS. 1 and 2, racks 12 and 14 are mounted adjacent one another and switch units 16 are mounted to rack 14. As shown, switch units 16 are Nortel OPTera Connect HDX switches but it is anticipated that different types of switches from different manufacturers, as well as other types of telecommunications equipment, may be used in rack 14 within the scope of the present invention. Rack 14 includes a base 18, rear vertical supports 22, an intermediate vertical support 18 and multiple braces 20 extending between supports 22 and 18. The areas between vertical supports 18 and 22, and between vertical support 18 and a front vertical support 26 are open so that air may pass through.

Figure 6:
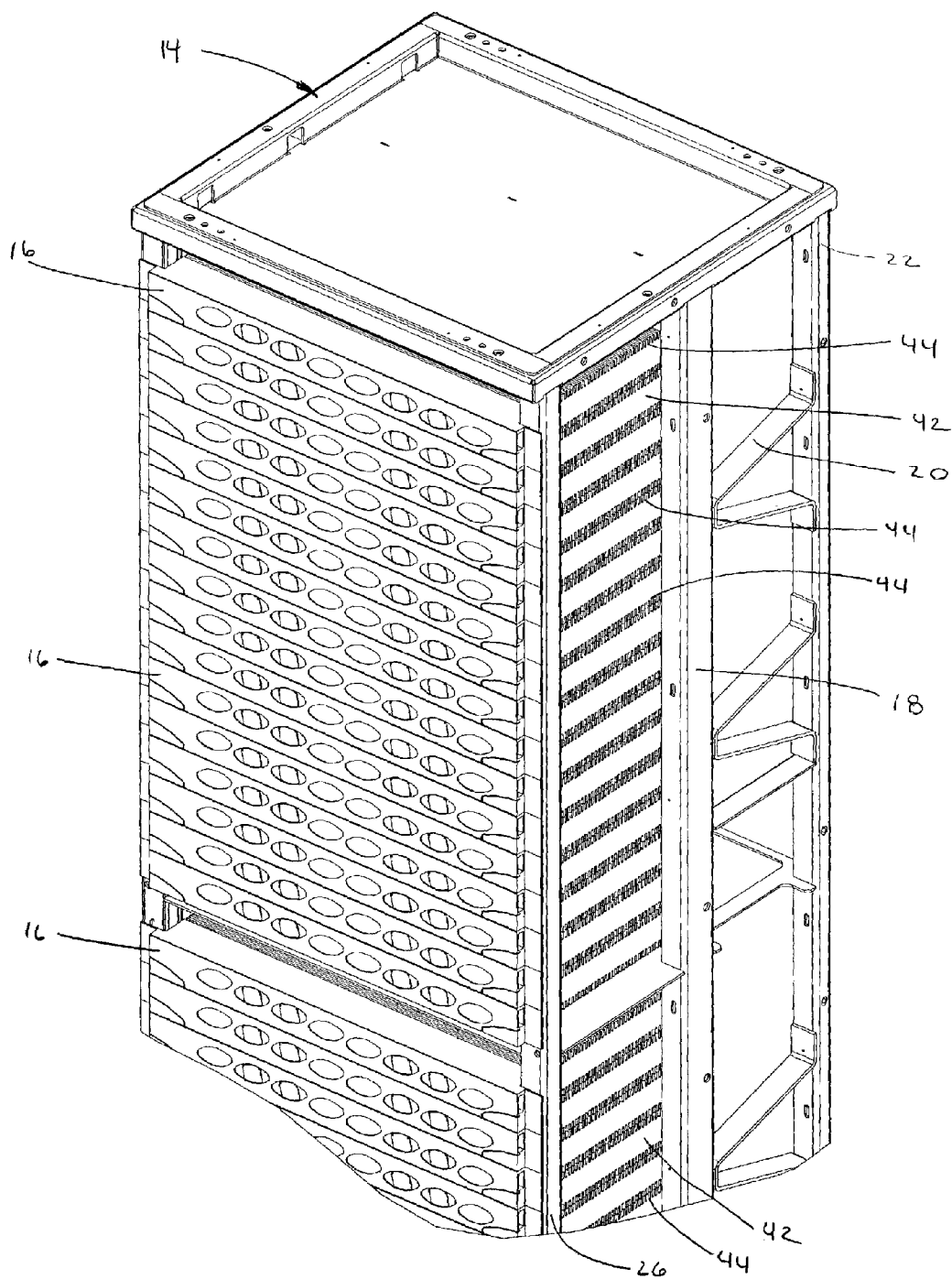
FIG. 6 is a front perspective view of the telecommunications equipment rack with optical switching equipment of FIG. 1.

As shown in FIGS. 2 and 6, each switch 16 includes a housing 42 with a finned heat sink 44 mounted to both the top and bottom. Finned heat sinks 44 permit air to enter rack 14 between vertical supports 26 and 18 on one side, and pass through a heat sink 44 and exit through the opposite side. (See also FIG. 12 for a view of heat sinks 44.) Depending on the heat load generating by the heat producing elements within switches 16, it may be desirable to enhance the rate of airflow through heat sinks 44.

Figure 7:
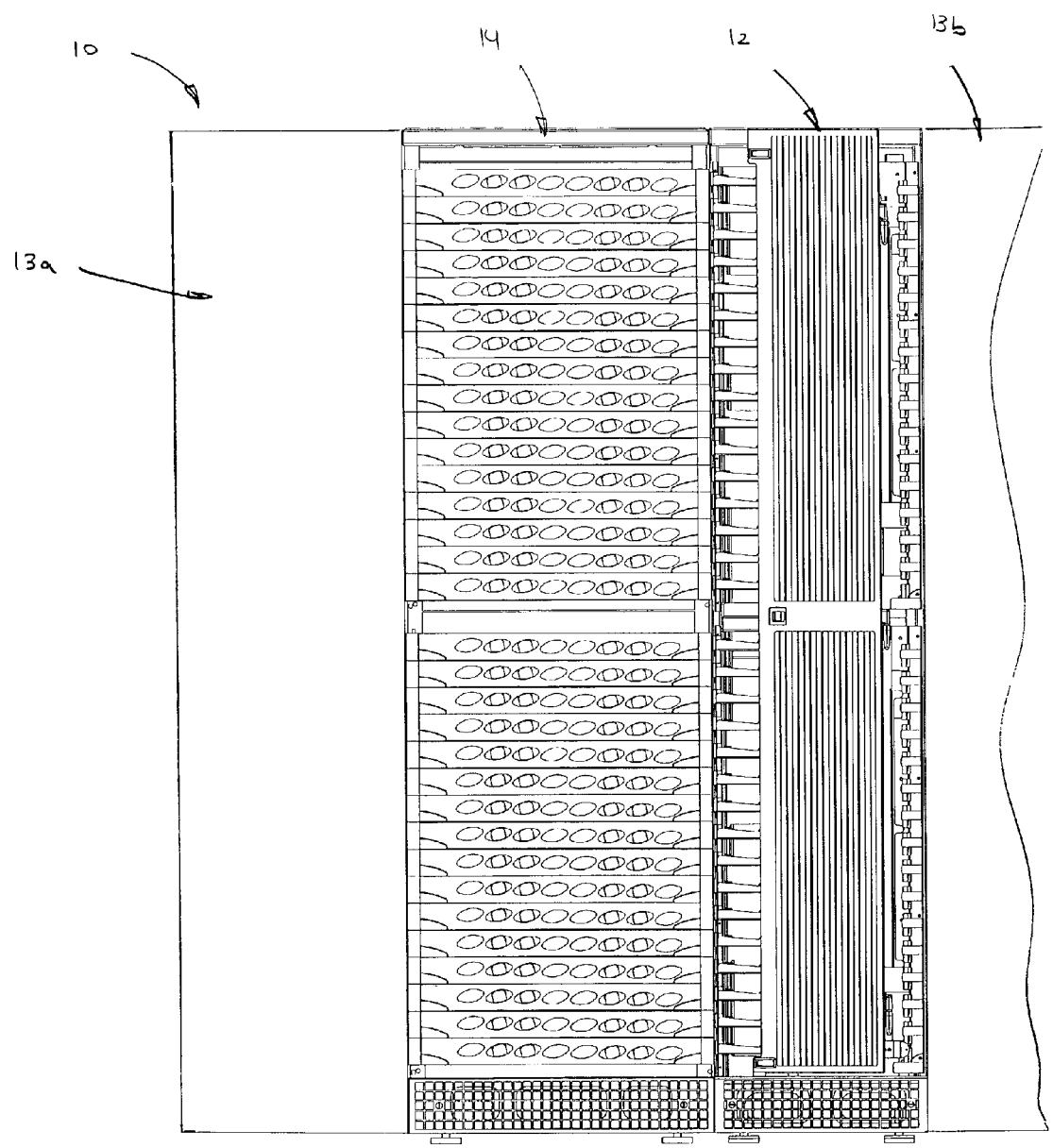
FIG. 7 is a front view of an alternative embodiment telecommunications equipment lineup, including an air handling equipment rack and a third telecommunications equipment rack.

As shown in FIG. 7, this may be accomplished within lineup 10 by including a rack 13a on an opposite side of rack 14 from rack 12. Rack 13a includes a fan or similar device for creating a low pressure area adjacent heat sinks 44 between vertical supports 18 and 26 of rack 14. This low pressure area will draw air through heat sinks 44, with the air entering heat sinks 44 adjacent rack 12. It is desirable that rack 12 include passages for air to pass through to reach heat sinks 44. Also shown in FIG. 7 is a third telecommunications equipment rack 13b on the side of rack 12 opposite rack 14.

Figure 3:
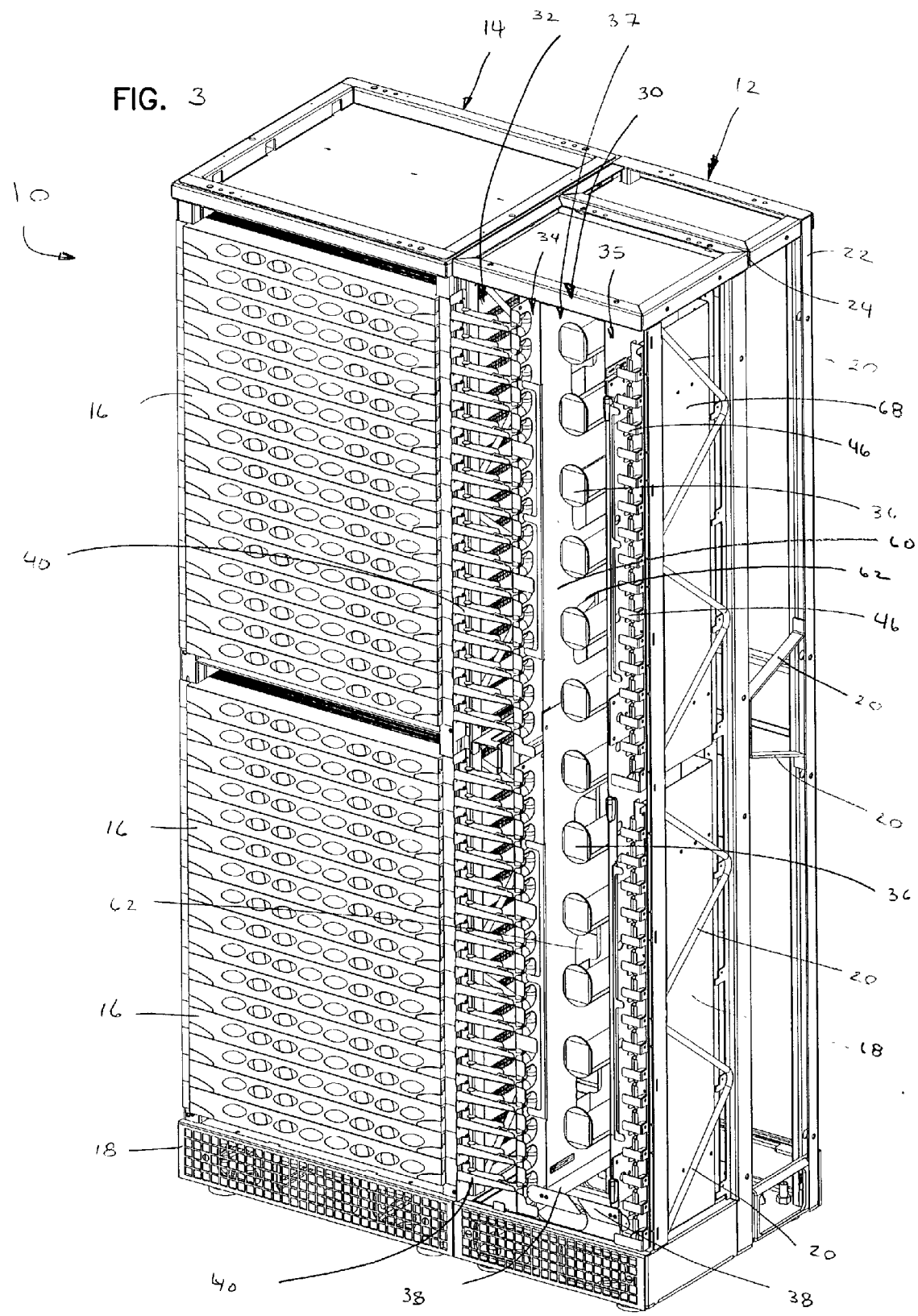
FIG. 3 is the telecommunications equipment racks of FIG. 1, with a door removed which had been covering a cable slack storage arrangement mounted to cable management equipment rack.
Figure 4:
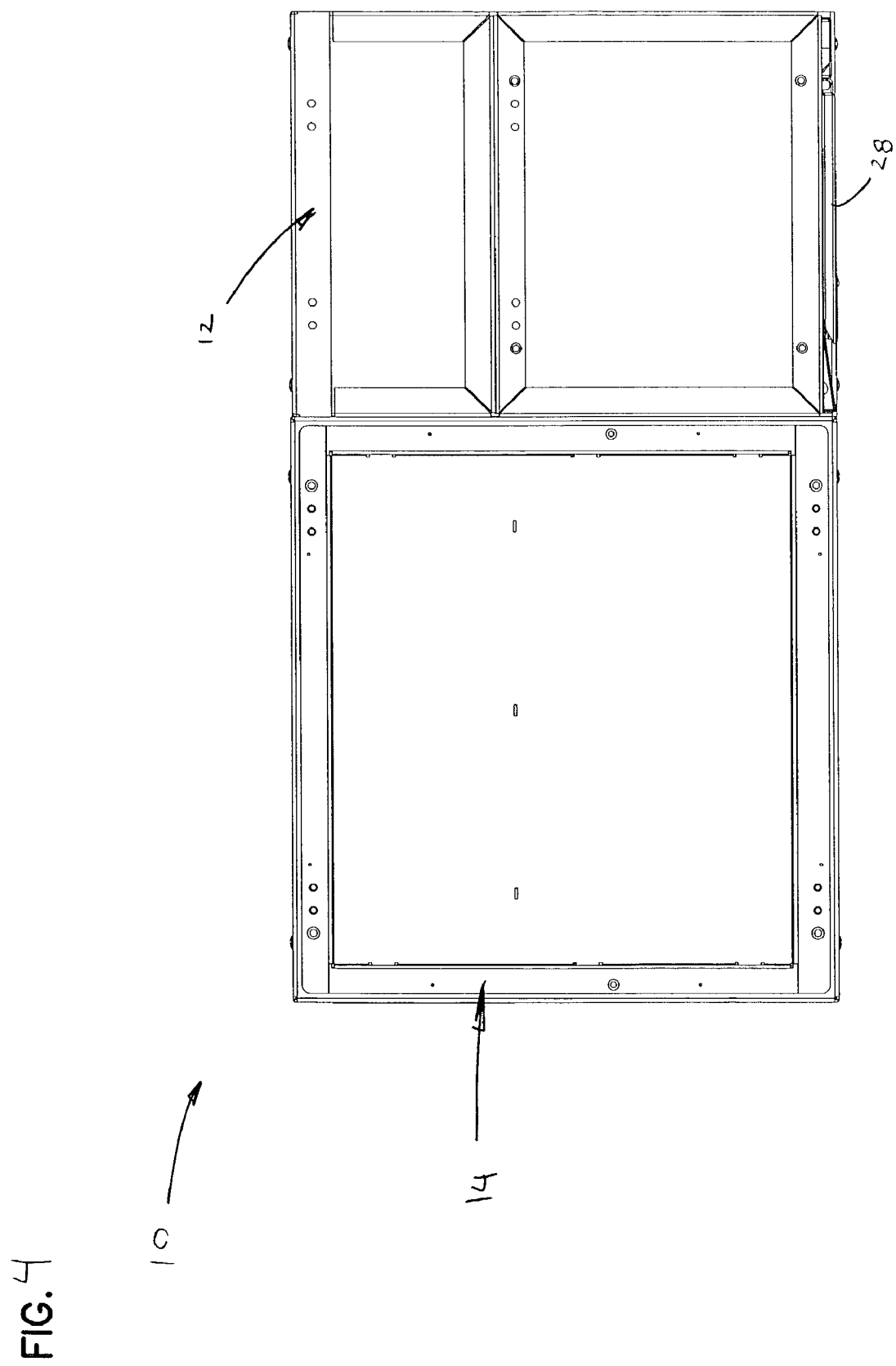
FIG. 4 is a top view of the telecommunications equipment racks of FIG. 1.

Referring now to FIGS. 1 and 3, rack 12 includes vertical supports 18, 22 and 26, and multiple braces 20 extending between the vertical supports. As with rack 14, the areas between the vertical supports are open so that air may pass through. Rack 14 includes an open fronted ventilation space 32 adjacent rack 14. Mounted across ventilation space 32 are a plurality of cable troughs 40. Troughs 40 are configured to organize cables and permit air flow through into ventilation space 32 between troughs 40 through the front.

A door 28 is hingedly mounted to the front of rack 12 over the open front of interbay management panel 30. Door 28 is releasably held in a closed positioned as shown in FIG. 1 by door catches 29. As shown in FIG. 3, door 28 may also be removed to allow access into rack 12. Panel 30 provides cable management and cable slack storage for cables extending from switches 16 through troughs 40 and into rack 12.

Cables enter rack 12 through troughs 40 and pass into a first vertical cable way 34, which is part of panel 30. Once in cable way 34, the cables extend downward to the lower edge of panel 30 and pass over edge protectors 38 before extending upward into a slack storage area 37, which includes a plurality of cable slack storage spools 36. Cables extend up to and over one of spools 36 and then downward to a second edge protector 38 before extending upward within a second vertical cable way 35. Mounted along an edge of cable way 35 opposite slack storage area 30 are mounted a plurality of cable exits 46, adjacent vertical support 26.

Figure 11:
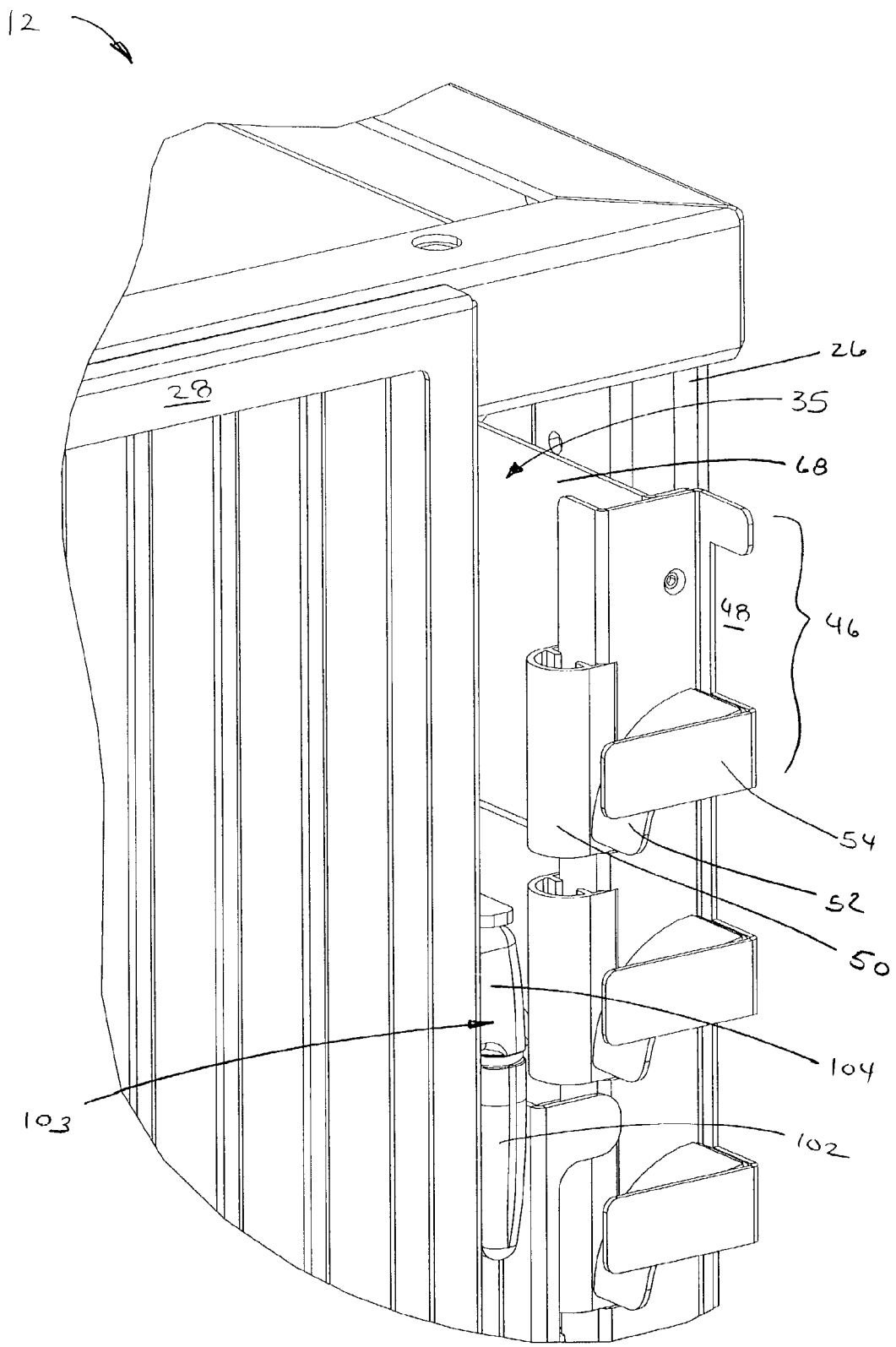
FIG. 11 is a front perspective view of a top corner of the telecommunications equipment rack for cable management of FIG. 1.

As shown in FIG. 11, cable exit 46 includes an opening 48 for the cables to pass through and out of rack 12. These cables might extend to equipment mounted in rack 13b, shown in FIG. 7, or to other equipment mounted within the line-up or installation. An edge protector 50 provides bend radius protection about a vertical axis for cables extending from second vertical cable way 35 through opening 48. A curved ramp 52 provides bend radius protection for these same cables about a horizontal axis. A cable retaining tab 54 extends adjacent to ramp 52 to help hold cables on ramp 52.

Figure 5:
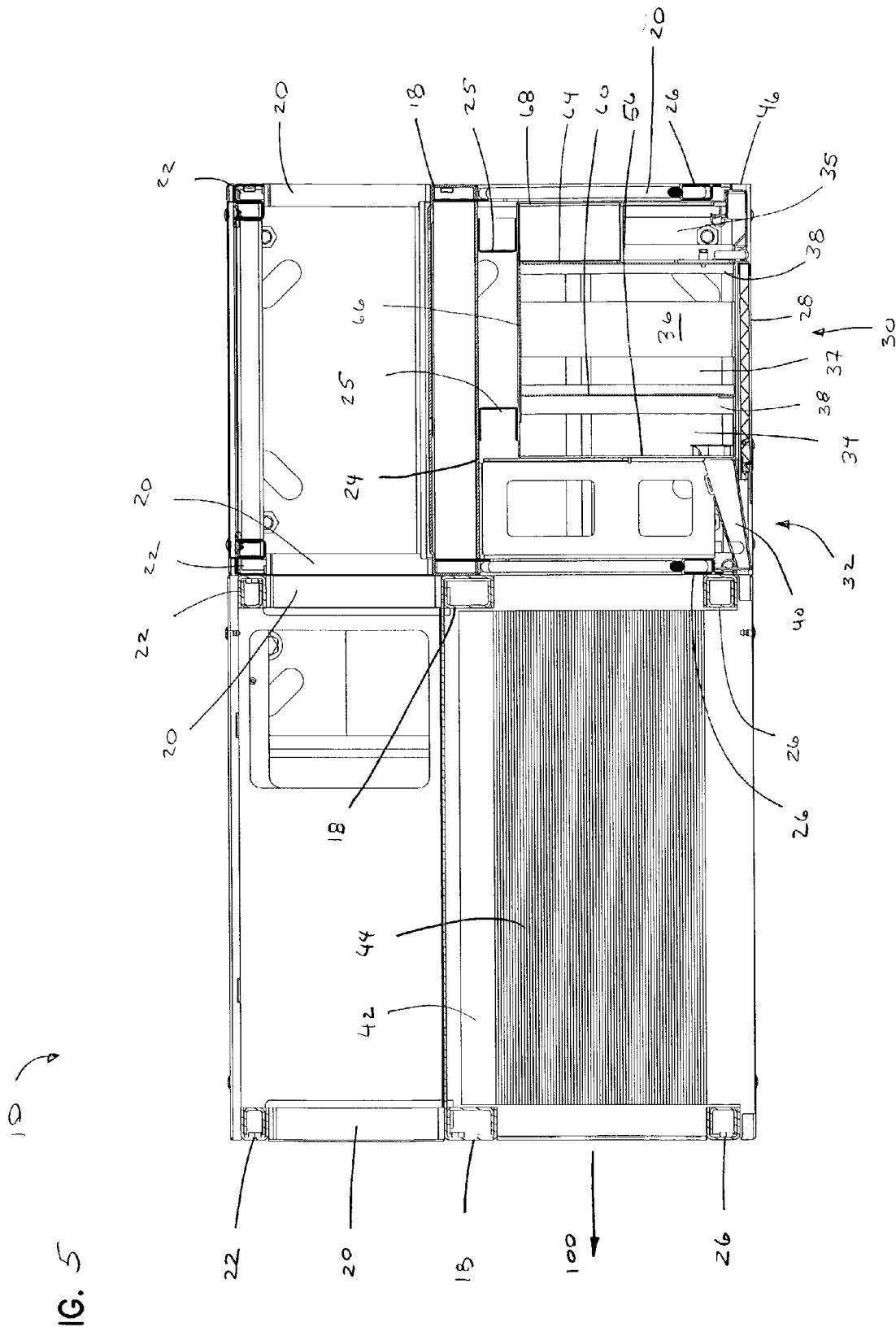
FIG. 5 is a top cross-sectional view of the telecommunications equipment racks of FIG. 1, taken along line 5—5 in FIG. 1.

Referring now also to FIG. 5, ventilation space 32 is defined forward of an intermediate wall 24 extending between vertical supports 18. A first outer bulkhead 56 defining a side of panel 30 also defines a side of ventilation space 32, as well as one side of first vertical cable way 34. A first intermediate bulkhead 60 extends between first vertical cable way 34 and slack storage area 37 and one of the edge protectors 38 is located at a bottom edge of bulkhead 60. A second intermediate bulkhead 64 extends between cable slack storage area 37 and second vertical cable way 35, and one of the edge protectors 38 is located at a bottom edge of bulkhead 64.

Figure 9:
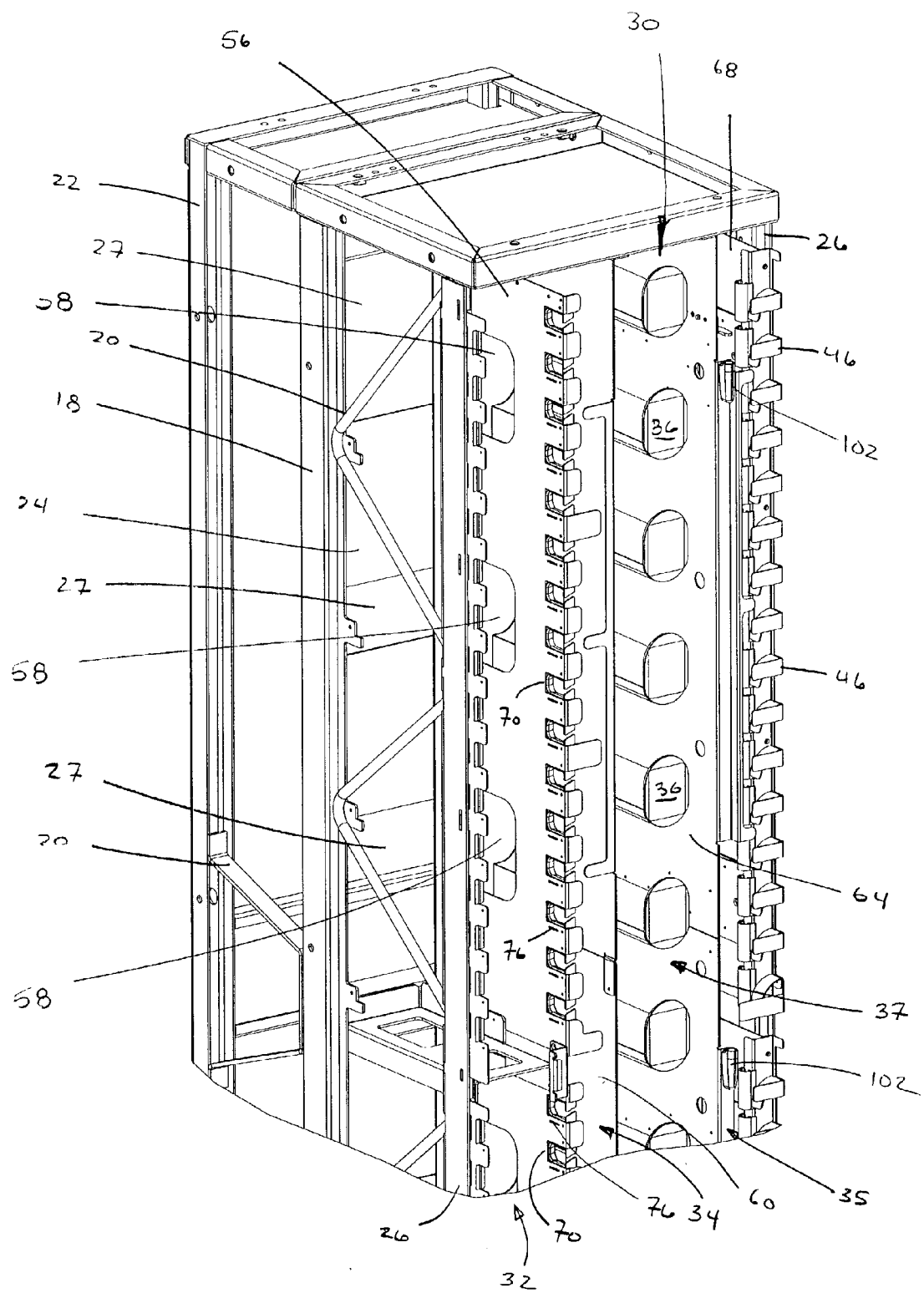
FIG. 9 is a front perspective view of the telecommunications equipment rack of FIG. 7, with the cable troughs removed from an open front of a ventilation space.

As shown in FIG. 3, a plurality of openings 62 are formed in first intermediate bulkhead 60. As shown in FIG. 9, a plurality of openings 58 are formed in bulkhead 56. Openings 58 and 62 cooperate to permit additional air flow paths into ventilation space 32.

Figure 8:
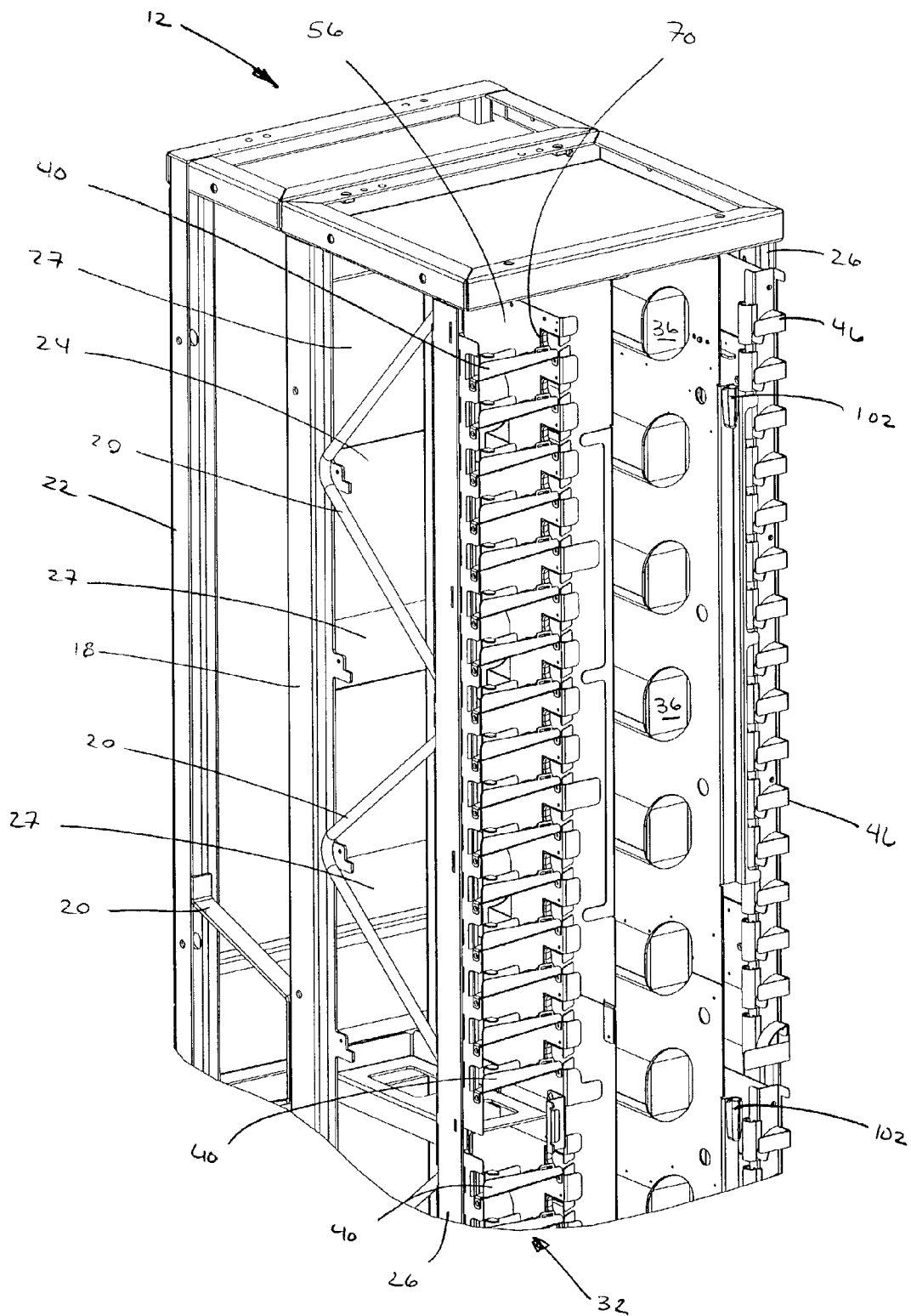
FIG. 8 is a front perspective view of the telecommunications equipment rack for cable management of FIG. 3.
Figure 10:
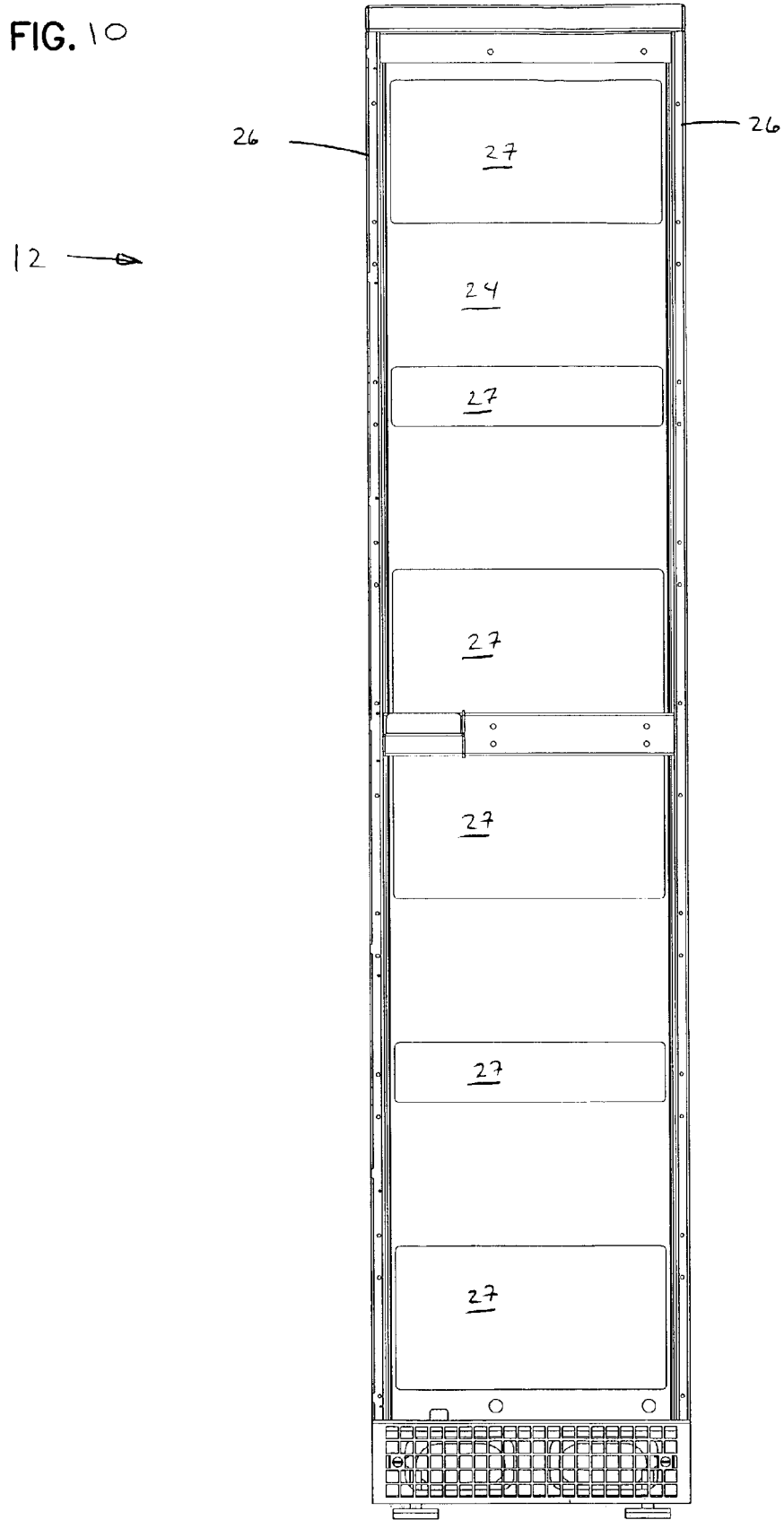
FIG. 10 is a front view of the telecommunications equipment rack of FIG. 7, with the cable management structures removed.

Referring back now to FIG. 5, a pair of standoffs 25 are mounted to intermediate wall 24. Rear bulkhead 66 of panel 30 is mounted to standoffs 25. Standoffs 25 are configured so that panel 36 extends to a position directly behind door 28. Spools 36 extend forward from rear bulkhead 66 between first and second intermediate bulkheads 60 and 64. First vertical cable way 34 is defined by bulkhead 56, rear bulkhead 66 and first intermediate bulkhead 60. Second vertical cable way 35 is defined by second intermediate bulkhead 64, rear bulkhead 66 and a second outer bulkhead 68. Cable slack storage area 37 is defined between intermediate bulkheads 60 and 64, and rear bulkhead 66. Panel 30 is defined between first and second outer bulkheads 56 and 68, and rear bulkhead 66. Troughs 40 extend from adjacent front vertical supports 26 to first outer bulkhead 56 of panel 30. As shown in FIGS. 8, 9 and 10, intermediate wall 24 includes a plurality of openings 27. These openings 27 also provide an airflow path into ventilation space 32.

Arrow 100 in FIG. 5 indicates the direction of airflow out of heat sink 44 when line up 10 is configured as shown in FIG. 7. Air would enter heat sink 44 from ventilation space 32. Air can enter ventilation space 32 between troughs 40, through openings 58 in first outer bulkhead 56, and through openings 27 is intermediate wall 24.

Figure 12:
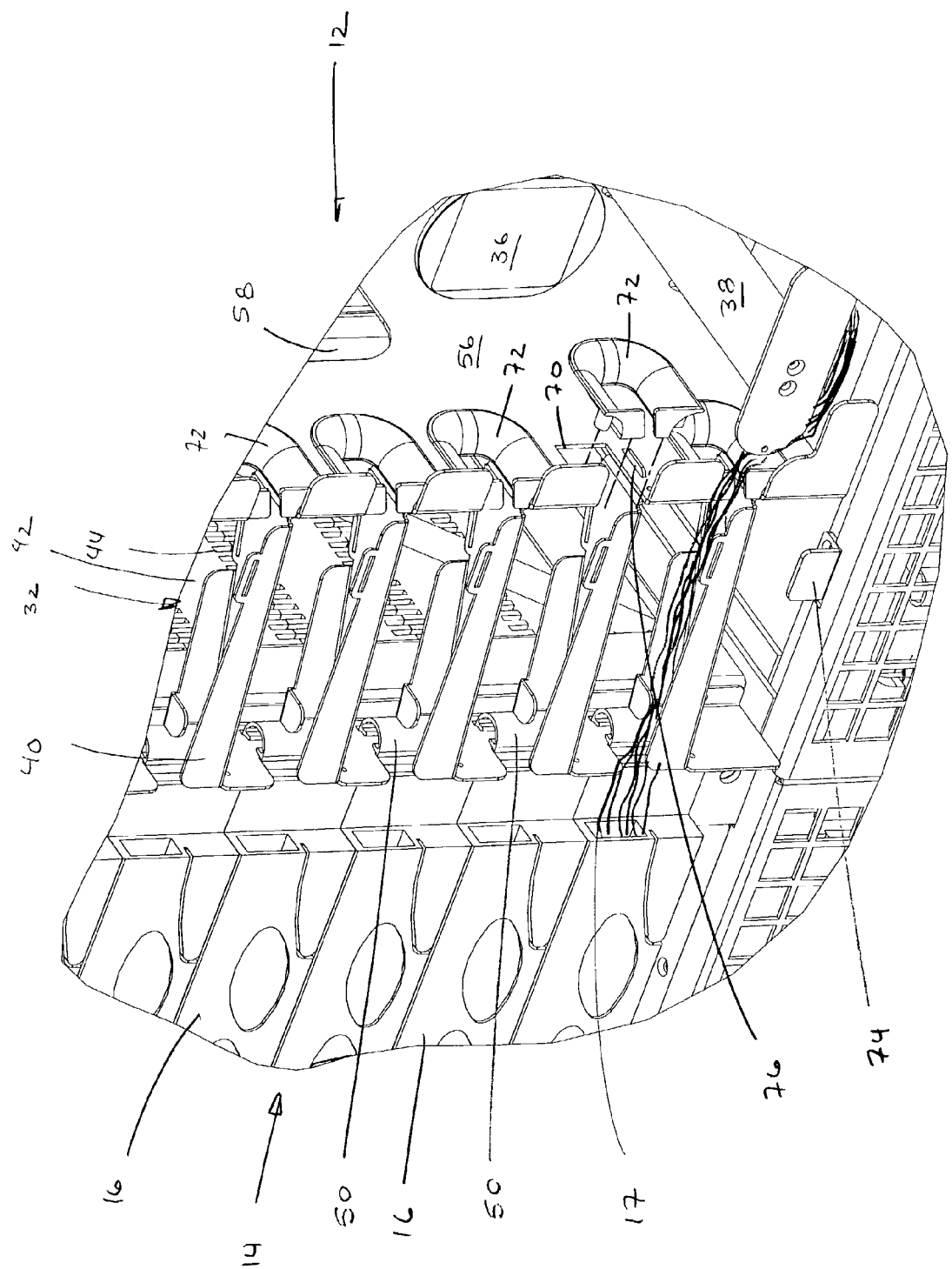
FIG. 12 is a front perspective view of the telecommunications racks of FIG. 3, showing the cable troughs extending between the optical switching equipment and the cable management panel, with the first outer bulkhead of the panel removed for clarity and one of the cable entry protectors exploded from the first outer bulkhead.

Referring now to FIGS. 8, 9 and 12, first outer bulkhead 56 includes a plurality of openings 70 to which are mounted a plurality of cable entry protectors 72. Protectors 72 provide bend radius protection for cables passing through troughs 40 into panel 30. Also formed through first outer bulkhead 56 are a plurality of openings 76 adjacent openings 70 for receiving a mounting tab of trough 40, which will be described in further detail below. Catch 74 extends upwards along the front of rack 12 and releasably engages the lower catch 29 of door 28. An edge protector 50 is also mounted adjacent each trough 40 to provide bend radius protection for cables extending into rack 12 from rack 14. In this view, heat sinks 44 of optical switches 16 are also visible.

Referring now to FIGS. 13 through 17, trough 40 includes a front wall 78, a rear wall 80 and a floor 82, defining the open topped trough 40. At a first end 81 of floor 82 and extending beneath the floor is a mounting flange 86 with an opening 88 for receiving a fastener such as a screw. At a second end 83 of floor 82 and extending beneath the floor is a mounting flange 85 including a tab 84 extending generally parallel to floor 82 and an extension 90 including an opening 92 for receiving a fastener such as a screw. Tab 84 is received within opening 76 in first outer bulkhead 56, as shown in FIG. 12. As shown in FIG. 14, floor 82 increases in width from first end 81 to second end 83. Front wall 78 decreases in height above floor 82 from first end 81 to second end 83. Rear wall 80 does not extend the full distance between first end 81 and second end 83 but also decreases in height similar to front wall 78.

Along a top edge of rear wall 80 adjacent first end 81 is a cable retaining tab 94. Tab 94 extends partially across the open top of trough 40 and defines a gap 95 between tab 94 and front wall 78. Gap 95 is sufficiently large to permit fiber optic cables to be passed through gap 95 into trough 40. It is desirable that gap 95 be no larger than necessary to permit the easy passage of cables into trough 40, so that tab 94 may retain cables within trough 40 from accidental removal.

Figure 18:
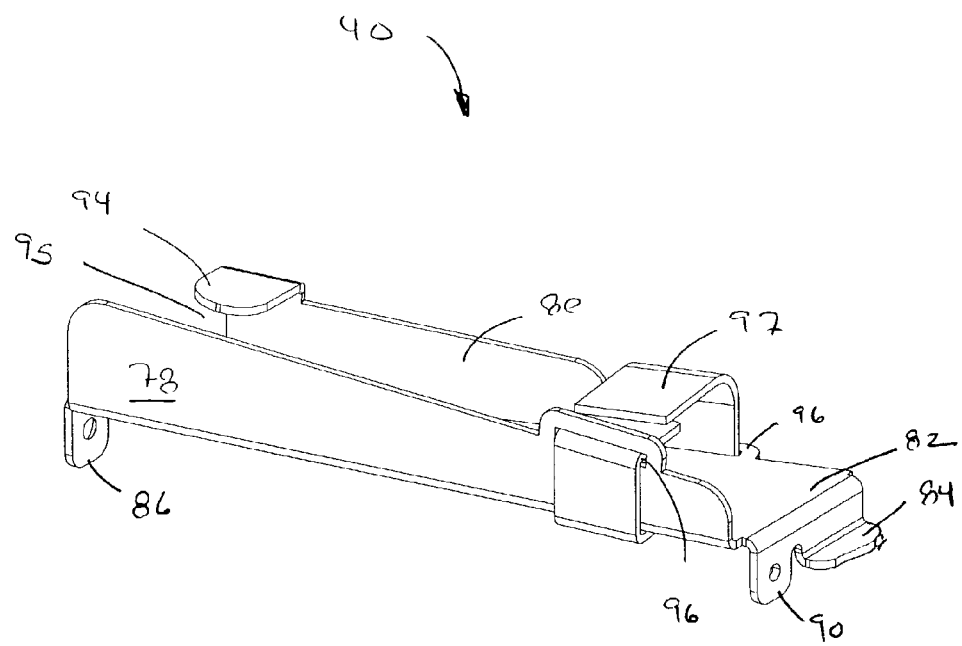
FIG. 18 is a front perspective view of the trough of FIG. 13, with a releasable cable retaining strap.
Figure 19:
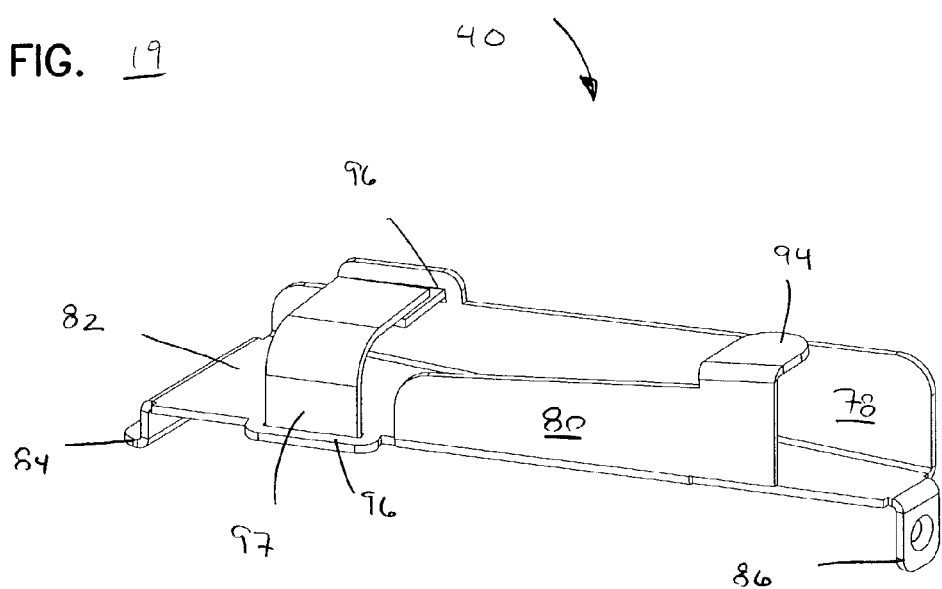
FIG. 19 is a rear perspective view of the trough of FIG. 18.

Along a top edge of front wall 78 adjacent second end 83 is a cable retaining strap slot 96. A similar cable retaining strap slot 96 is formed in floor 82 in the portion where rear wall 80 does not extend. A cable retaining strap may be passed through slots 96 to assist cable retaining tab 94 in keeping cables within trough 40. FIGS. 18 and 19 show trough 40 with such a cable retaining strap 97 inserted through slots 96. As shown, strap 97 includes a releasable closure, such as a Velcro or similar hook-and-eye closure, allowing easy opening of strap 97 to insert or remove cables from trough 40, while securely holding cables within trough 40 when closed. Alternatively, a cable tie may be extended through slots 96 used to retain cables in trough 40. Cables ties would have to be cut and replaced to allow cables to be inserted or removed from trough 40.

The tapering of front and rear walls 78 and 80 of trough 40 is intended to reduce the frontal area of trough 40. When trough 40 is mounted as shown in FIG. 12 across the front of ventilation space 32, it is desirable for trough 40 to have a minimum of frontal area to allow a maximum of airflow past troughs 40 into ventilation space 32. At the same time, it may be desirable that trough 40 includes enough material in a vertical plane to permit sufficient strength in trough 40 to support the cables extending from trough 14 to trough 12. In addition, it may desirable that trough 40 also include a front wall sufficiently tall above floor 82 to protect the cables within trough 40 from accidental damage. These competing desirable features have been accommodated in the design of the present trough. It is anticipated that additional variations of the height of the front wall, the height and length of the rear wall, and the width of the floor may be adopted based on the cable routing needs of the rack 14 to which trough 40 is mounted adjacently in rack 12.

In rack 14, switches 16 are configured to have a bundle of cables exiting rack 14 from each switch into a trough 40, wherein each bundle is generally rectangular with the long side of the rectangle oriented generally vertically. Panel 30 is configured to have the cables enter through an opening which is rectangular but with the long side of the rectangle oriented generally horizontally. Thus, trough 40 is configured to have taller front and rear wall 78 and 80, with a narrower floor 82 adjacent first end 81, to accommodate the vertically oriented cable bundle from switch 16. Trough 40 is configured with a wider floor 82 and a shorter front wall 78 adjacent second end 83 to accommodate the horizontally oriented opening 70 of panel 30.

If an alternative switch 16 were used which had a differently shaped bundle of cables exiting the switch into trough 40, the height and width of trough 40 could be adapted to meet this new shape. Similarly, if panel 30 were modified to have a cable entry opening 70 with a different shape, the height and width of trough 40 could be adapted to meet this new shape. Regardless of the height or width of first end 81 or second end 83, trough 40 should be shaped to have the minimum surface area possible while still providing adequate strength and cable protection.

It is also anticipated that cable retaining strap 97 and slots 96 could be replaced on trough 40 by the addition of a second cable retaining tab 94 extending from a top edge of front wall 78 where slot 96 is located. Second cable retaining tab 94 would be sized and shaped similarly to tab 94 extending from rear wall 80, and also include a gap 95 to permit insertion of cables into trough 40. Alternatively, it is anticipated that cable retaining tab 94 extending from rear wall 80 adjacent first end 81 could be replaced by a second cable retaining strap 97, with a slot 96 in rear wall 80 in place of tab 94.

Trough 40 as shown is made from metal. Trough 40 is configured so that trough 40 can be formed from a single piece of sheet metal. FIG. 20 shows a piece of sheet metal 98 configured to be bent into a trough 40. It is anticipated that other material may be used for trough 40, such as plastics. It is also anticipated that trough 40 could be made from several pieces of metal which are joined together by welding, soldering, gluing, etc., to form trough 40.

Figure 21:
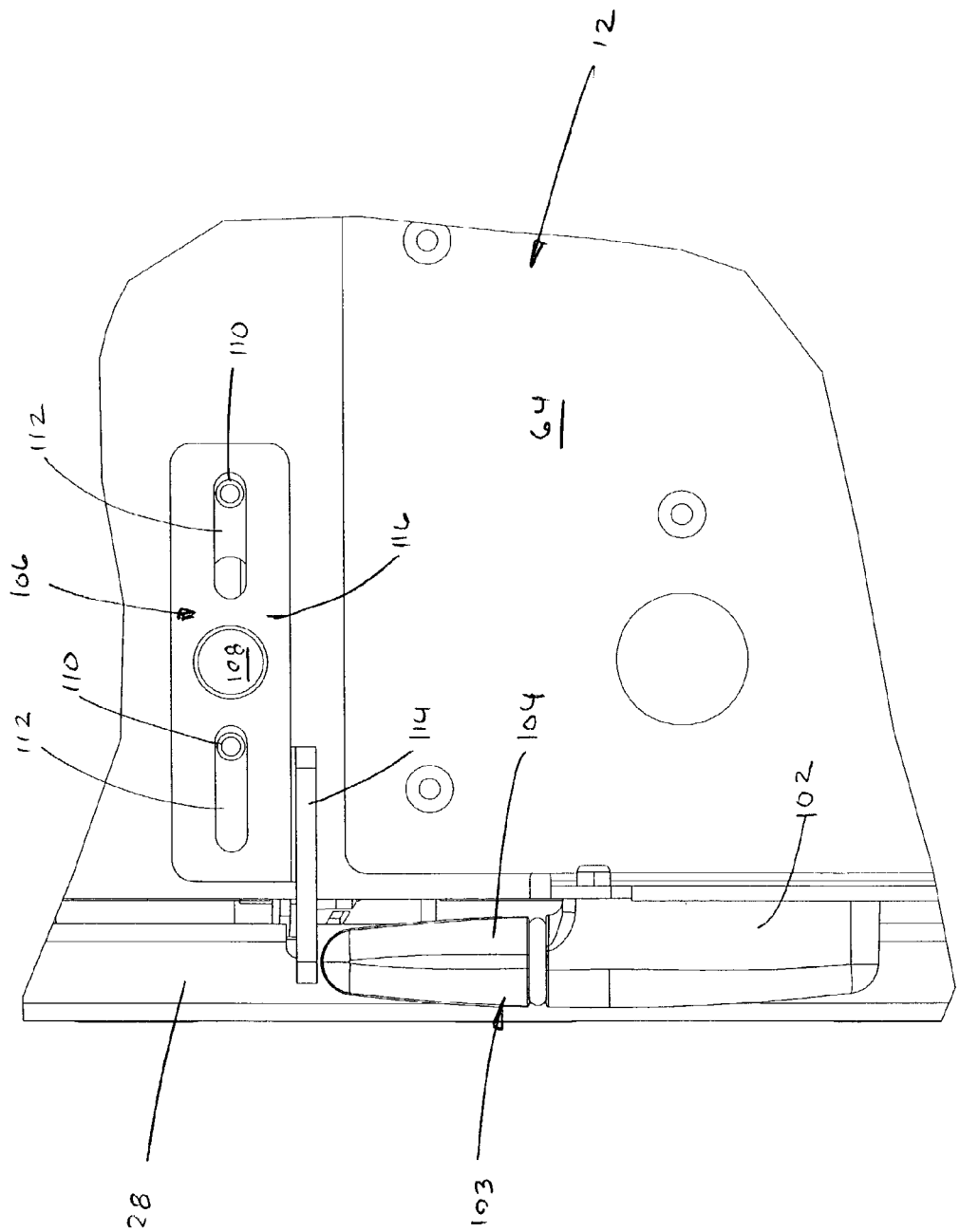
FIG. 21 is a side view of an intermediate bulkhead of a telecommunications equipment rack of FIG. 8 showing a hinge between the bulkhead and the door covering the cable slack storage panel, and a slide holding the hinge in a captive position.
Figure 22:
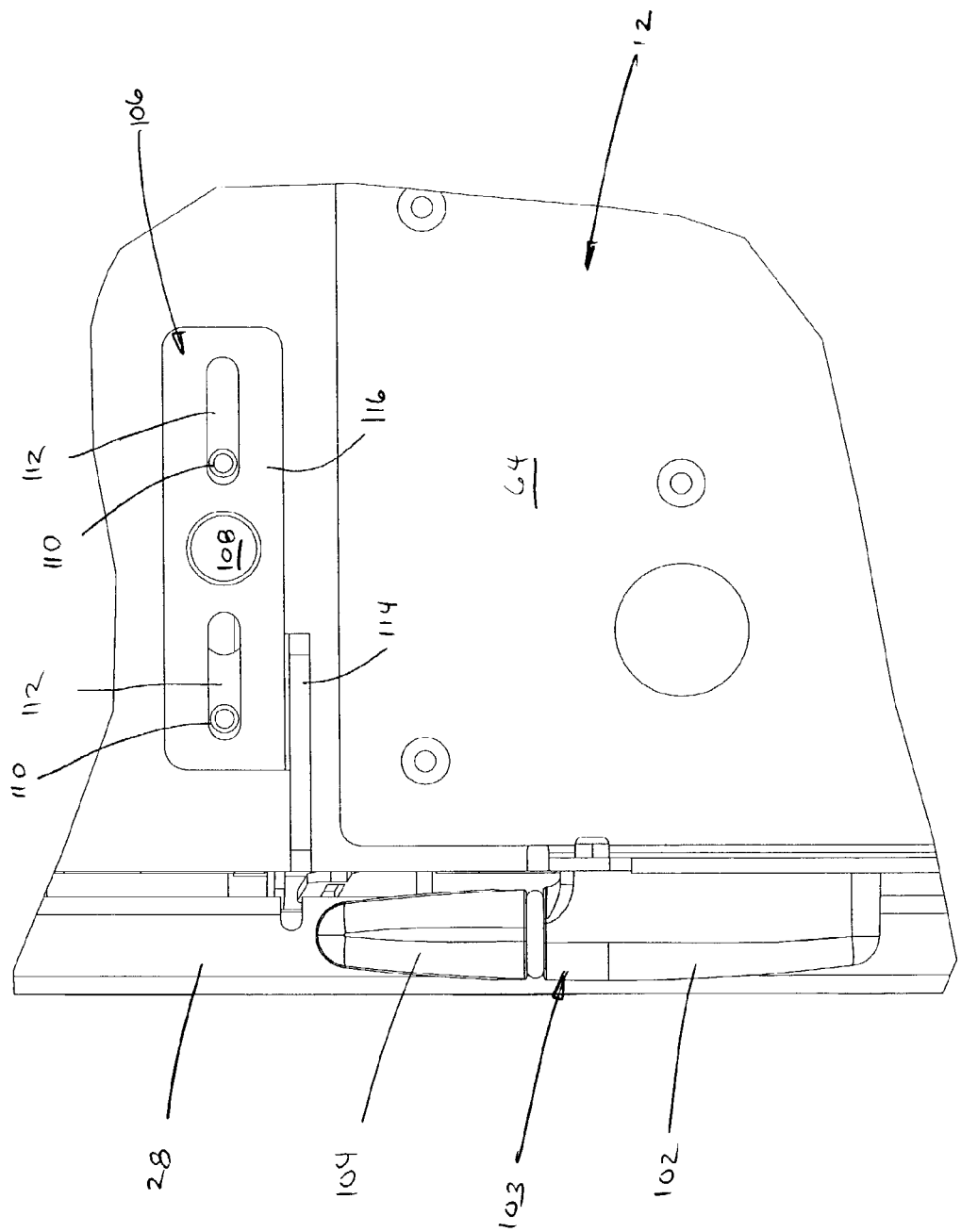
FIG. 22 is a side view of the hinge of FIG. 22, with the slide in a retracted position.
Figure 23:
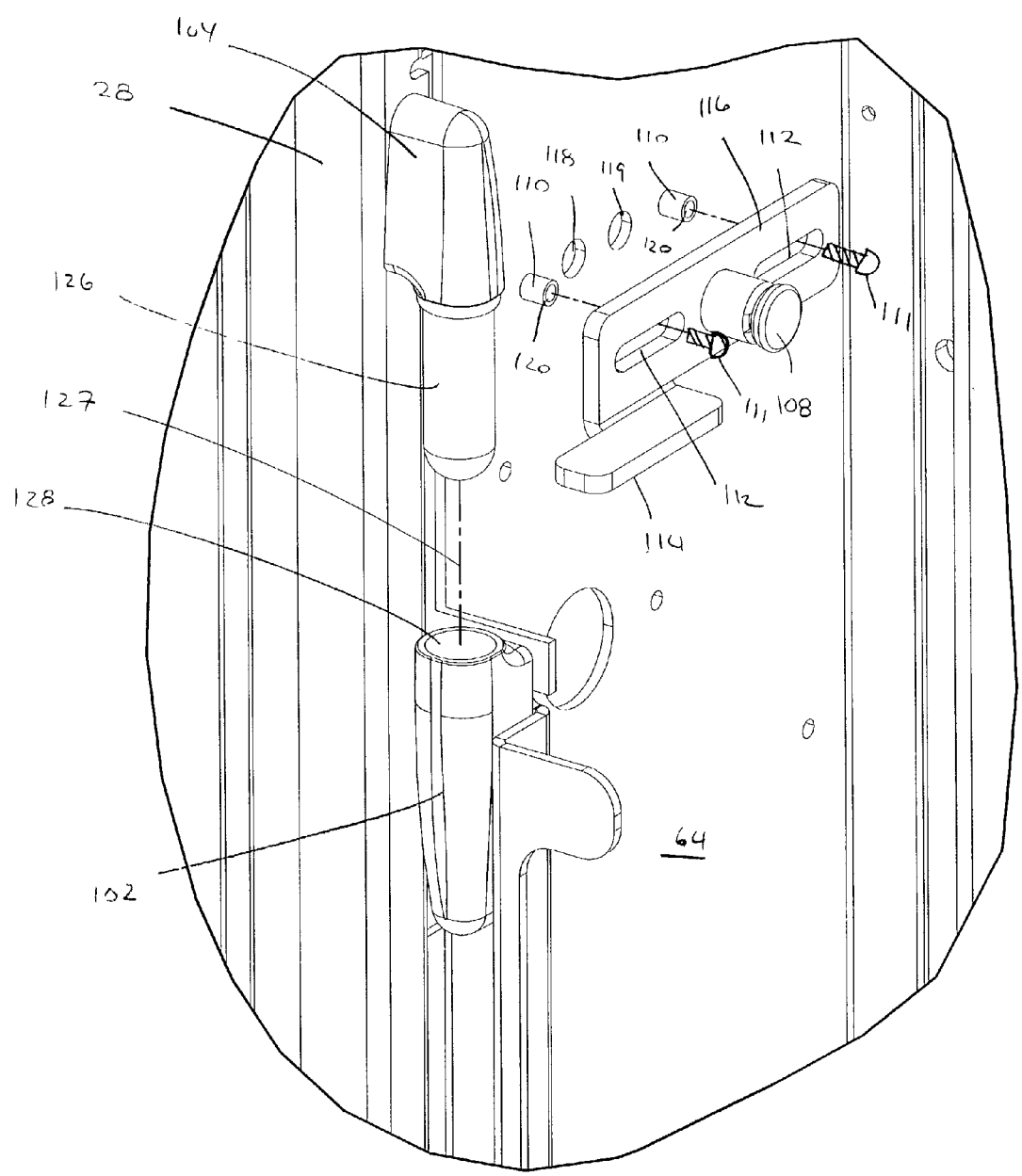
FIG. 23 is an exploded front perspective view of the hinge and slide of FIG. 21.

Referring back to FIG. 11, door 28 is removably held to rack 12 by a hinge 103 which includes a socket 102 attached to rack 12 and a pin 104 attached to door 28. Socket 102 defines an axis of insertion (shown as axis 127 in FIG. 23) for receiving pin 104. Pin 104 slips into socket 102 and allows door 28 to be rotated about hinge 103, with pin 104 rotating about the axis of insertion. As shown in FIGS. 21, 22 and 23, pin 104 and socket 102 are releasably held together by a slide 106 mounted to rack 12. In FIG. 21, slide 106 in is a captive position, with extension 114 directly above pin 104, preventing door 28 from being lifted off rack 12. FIG. 22 shows slide 106 is a retracted position, so that door 28 can now lifted off rack 12. Hinge 103 as shown is a hinge supplied by H. A. Guden Co., Inc. It is anticipated that a variety of types and styles of hinges may be used to releasably and hingedly mount door 28 to rack 12. FIG. 23 shows a hinge pin 126 extending down from pin 104 and pin opening 128 of socket 102 for receiving hinge pin 126. Hinge pin 126 is sized to fit snugly within pin opening 128 while being slightly smaller to permit easy movement of door 28 about hinge 103. Hinge pin 126 and pin opening 128 are preferably made of durable and compatible materials which will allow smooth movement of pin 126 within opening 128.

Slide 106 is slidably mounted to rack 12 within second vertical cable way 35, along second intermediate bulkhead 64. A pair of pins 110 extend from bulkhead 64 into a pair of elongated slots 112 is a slide body 116. In between slots 112 is a spring loaded pin catch 108. As shown in FIG. 23, openings 118 and 119 are formed in bulkhead 64 between pins 110. Pin catch 108 extends through slide body 116 and engages opening 118 when slide 106 in is the captive position. Pin catch 108 similarly engages opening 119 when slide 106 is in the retracted position. To hold slide 106 to bulkhead 64, fasteners such as screws 111 are inserted into an opening 120 of each pin 110 when pins 110 extend into slots 112.

Referring now to FIGS. 24 through 29, slide 106 is shown in additional detail. Pin catch 108 includes a pin 122 which engages openings 118 and 119 of bulkhead 64. Pin 122 can be retracted from either opening 118 or 119 by pulling on catch 108, while catch 108 includes a spring biasing pin 122 in the direction of bulkhead 64. Catch 108 is held to slide body 116 within a pin catch mounting opening 124, located between slots 112.

Although the foregoing invention has been described in detail by way of illustration and example, for purposes of clarity of understanding, it will be obvious that changes and modifications may be practiced which are within the scope of the present invention as embodied in the claims appended hereto.

What is claimed is:

1. A telecommunications assembly comprising:
   a telecommunications rack;
   a door;
   a hinge rotatably mounting the door to the telecommunications rack, the hinge including;
   a first hinge including a single pin removably and rotatably situated within a single mating socket, one of the pin or the socket attached to the door and the other attached to the rack, the socket defining a first axis of insertion of the pin and the pin rotating about the first axis of insertion;
   a single slide mounted to the telecommunications rack adjacent and above the socket of the first hinge and movable between a captive position and a retracted position;
   the slide spaced apart from the socket of the first hinge so that the slide in the captive position extends across the first axis of insertion of the pin of the first hinge and the pin of the first hinge cannot be removed from the socket of the first hinge, and the slide in the retracted position does not extend across the first axis of insertion, allowing the door to be lifted generally parallel to the first axis of insertion relative to the telecommunications rack and the pin of the first hinge to be removed from the socket of the first hinge.

2. The telecommunications assembly of claim 1, wherein the door is mounted to the telecommunications rack by the first hinge and a second hinge, the second hinge including a single pin removably and rotatably situated within a single mating socket, the socket of the second hinge defining a second axis of insertion of the pin of the second hinge and the pin of the second hinge rotating about the second axis of insertion, and the insertion axis of the first and second hinges aligned with each other and situated vertically.

3. A telecommunications assembly comprising:
   a telecommunications rack;
   a door;
   a hinge rotatably mounting the door to the telecommunications rack, the hinge including;
   a first hinge including a first pin removably and rotatably situated within a first mating socket, one of the first pin or the first socket attached to the door and the other attached to the rack, the first socket defining a first axis of insertion of the pin and the first pin rotating about the first axis of insertion;
   a slide mounted to the telecommunications rack adjacent the first socket and movable between a captive position and a retracted position;
   the slide spaced apart from the first socket so that the slide in the captive position extends across the first axis of insertion of the first pin and the first pin cannot be removed from the first socket, and the slide in the retracted position does not extend across the first axis of insertion, allowing the first pin to be removed from the first socket;
   wherein the first socket is mounted to the telecommunications rack, the first pin is mounted to the door, and the slide is mounted to the telecommunications rack.

4. The telecommunications assembly of claim 3, wherein the telecommunications rack includes a cable slack storage panel and the door blocks access into the cable slack storage panel when the pin of the first hinge is inserted within the socket of the first hinge.

5. The telecommunications assembly of claim 3, wherein the door extends generally the full height of the rack and the first axis of insertion is generally vertical.

6. A telecommunications assembly comprising:
   a telecommunications rack;
   a door;
   a hinge rotatably mounting the door to the telecommunications rack, the hinge including;
   a first hinge including a first pin removably and rotatably situated within a first mating socket, one of the first pin or the first socket attached to the door and the other attached to the rack, the first socket defining a first axis of insertion of the pin and the first pin rotating about the first axis of insertion;
   a slide mounted to the telecommunications rack adjacent the first socket and movable between a captive position and a retracted position, the slide including a catch which releasably engages a first opening in the bulkhead to releasably hold the slide in the captive position;
   the slide spaced apart from the first socket so that the slide in the captive position extends across the first axis of insertion of the first pin and the first pin cannot be removed from the first socket, and the slide in the retracted position does not extend across the first axis of insertion, allowing the first pin to be removed from the first socket;
   wherein the slide is mounted to a bulkhead of the rack and slides along the bulkhead between the captive and retracted positions.

7. The telecommunications assembly of claim 6, wherein the catch is spring biased to engage the first opening in the bulkhead.

8. The telecommunications assembly of claim 6, wherein the bulkhead includes a second opening to releasably engage the catch of the slide and releasably hold the slide in the retracted position.

9. The telecommunications assembly of claim 6, wherein the slide includes two elongated slots and the bulkhead includes two pins extending within the slots of the slide, the pins and slots cooperating to limit the range of motion of the slide.

10. The telecommunications assembly of claim 9, wherein the catch is positioned between the two slots of the slide and the first opening in the bulkhead is positioned between the pins.

11. A telecommunications assembly comprising:
a bulkhead adjacent to an opening;
a door;
a hinge rotatably mounting the door to the bulkhead so that the door covers the opening, the hinge including;
a first hinge including a first pin removably and rotatably situated within a first mating socket, one of the first pin or the first socket attached to the door and the other attached to the bulkhead, the first socket defining a first axis of insertion of the pin and the first pin rotating about the first axis of insertion;
a slide mounted to the bulkhead adjacent the first socket and movable between a captive position and a retracted position;
the slide spaced apart from the first socket so that the slide in the captive position extends across the first axis of insertion of the first pin and the first pin cannot be removed from the first socket, and the slide in the retracted position does not extend across the first axis of insertion, allowing the door to be lifted generally parallel to the first axis of insertion relative to the bulkhead and the first pin to be removed from the first socket.

12. A telecommunications assembly comprising:
a telecommunications rack;
a door;
a hinge rotatably mounting the door to the telecommunications rack, the hinge including;
a first hinge including a first generally cylindrical pin removably and rotatably situated within a first generally cylindrical mating socket, one of the first pin or the first socket attached to the door and the other attached to the rack, the first socket defining a first axis of insertion of the pin and the first pin rotating about the first axis of insertion;
a slide mounted to the telecommunications rack adjacent the first socket of the first hinge and movable between a captive position and a retracted position;
the slide spaced apart from the first socket so that the slide in the captive position extends across the first axis of insertion of the first pin and the first pin cannot be removed from the first socket, and the slide in the retracted position does not extend across the first axis of insertion, allowing the door to be lifted generally parallel to the first axis of insertion relative to the telecommunications rack and the first pin to be removed from the first socket.

13. The telecommunications assembly of claim 12, wherein the door is mounted to the telecommunications rack by the first hinge and a second hinge, the second hinge including a second generally cylindrical pin removably and rotatably situated within a second generally cylindrical mating socket, the second socket defining a second axis of insertion of the second pin and the second pin rotating about the second axis of insertion, and the insertion axis of the first and second hinges aligned with each other and situated vertically.

14. The telecommunications assembly of claim 12, wherein the telecommunications rack includes a cable slack storage panel and the door blocks access into the cable slack storage panel when the pin is inserted within the socket.

15. The telecommunications assembly of claim 12, wherein the door extends generally the full height of the rack and the first axis of insertion is generally vertical.

16. The telecommunications assembly of claim 12, wherein the slide is mounted to a bulkhead of the rack and slides along the bulkhead between the captive and retracted positions.

17. The telecommunications assembly of claim 16, wherein the slide includes a catch which releasably engages a first opening in the bulkhead to releasably hold the slide in the captive position.

18. The telecommunications assembly of claim 17, wherein the catch is spring biased to engage the first opening in the bulkhead.

19. The telecommunications assembly removable cover of claim 17, wherein the bulkhead includes a second opening to releasably engage the catch of the slide and releasably hold the slide in the position.

20. The telecommunications assembly of claim 17, wherein the slide includes two elongated slots and the bulkhead includes two pins extending within the slots of the slide, the pins and slots cooperating to limit the range of motion of the slide.

21. The telecommunications assembly of claim 20, wherein the catch is positioned between the two slots of the slide and the first opening in the bulkhead is positioned between the pins.

22. A telecommunications assembly comprising:
a telecommunications rack;
a door;
a hinge rotatably mounting the door to the telecommunications rack, the hinge including;
a first hinge and a second hinge each including a generally cylindrical pin removably and rotatably situated within a generally cylindrical mating socket, one of the pins or the sockets attached to the door and the other attached to the rack, the sockets defining an axis of insertion of the pins and the pins rotating about the axis of insertion;
a slide mounted to the telecommunications rack adjacent one of the sockets and movable between a captive position and a retracted position;
the slide spaced apart from the adjacent socket so that the slide in the captive position extends across the axis of insertion of the corresponding pin and the corresponding pin cannot be removed from the adjacent socket, and the slide in the retracted position does not extend across the axis of insertion, allowing the corresponding pin to be removed from the adjacent socket,
wherein the sockets are mounted to the telecommunications rack, the pins are mounted to the door, and the slide is mounted to the telecommunications rack.

* * * * *

UNITED STATES PATENT AND TRADEMARK OFFICE
CERTIFICATE OF CORRECTION

PATENT NO. : 6,981,750 B2
DATED : January 3, 2006
INVENTOR(S) : Krampotich

It is certified that error appears in the above-identified patent and that said Letters Patent is hereby corrected as shown below:

<u>Column 10,</u>
Lines 21-22, "assembly removable cover of claim 17," should read -- assembly of claim 17, --.

Signed and Sealed this

Twenty-third Day of May, 2006

JON W. DUDAS
*Director of the United States Patent and Trademark Office*